United States Patent [19]

Wintz et al.

[11] 3,877,026

[45] Apr. 8, 1975

[54] DIRECT DIGITAL LOGARITHMIC DECODER

[75] Inventors: Paul A. Wintz, Lafayette, Ind.; John R. Sergo, Jr., Delaware, Ohio

[73] Assignee: North Electric Company, Galion, Ohio

[22] Filed: Oct. 1, 1973

[21] Appl. No.: 402,342

[52] U.S. Cl. .................... 340/347 DA; 340/347 SH
[51] Int. Cl. .......................................... H03k 13/02
[58] Field of Search ................ 340/347 SH:347 DA; 179/15 AP, 15 AV; 325/38 B, 38 A, 62

[56] References Cited

UNITED STATES PATENTS

| | | | |
|---|---|---|---|
| 3,397,396 | 8/1968 | Kaneko | 340/347 DA |
| 3,653,035 | 3/1972 | Carbrex | 340/347 C |
| 3,731,300 | 5/1973 | Greutman et al. | 340/347 DA |

*Primary Examiner*—Malcolm A. Morrison
*Assistant Examiner*—Vincent J. Sunderdick
*Attorney, Agent, or Firm*—Johnson, Dienner, Emrich & Wagner

[57] ABSTRACT

A digital to analog converter is disclosed which converts digital code signals which exhibit logarithmic compression characteristics and which are representative of an analog input signal, such as voice, into an analog output signal approximating the encoded input. The apparatus is digitally controlled, performs decoding at minimal operating speed, and may be utilized on a per line basis.

19 Claims, 4 Drawing Figures

DIRECT DIGITAL LOGARITHMIC DECODER

BACKGROUND OF THE INVENTION

1. Field of the Invention

In general, this invention relates to digital information processing systems. More particularly, this invention relates to digital to analog decoding (conversion) apparatus and methods used for converting digital code words, which exhibit logarithmic compression characteristics and which are representative of an analog input signal, such as voice, into an analog output signal approximating said encoded input.

2. Description of the Prior Art

In PCM (pulse code modulation) communication systems, continuous time varying information signals, such as electrical speech signals, may be represented by a series of ON and OFF pulses. In this process, the signal is periodically sampled, quantized, and encoded into binary code words indicative of the amplitude of the input signal.

In the quantizing process, the exact level of the time varying input signal at the instant the sample is taken is approximated by one of a number of discrete values called quantum levels. The difference between the instantaneous value of the input signal and the quantum level actually transmitted is called quantizing error and gives rise to what is known variously as quantizing noise or distortion.

Quantizing distortion is especially objectionable and very often intolerable when the instantaneous value or magnitude of the input signal is small, but is usually of little or no significance when the instantaneous magnitude of the input signal is high. For higher quality and more effective transmission, it is therefore desirable to have more quantum levels for the lower amplitudes of the input signal and relatively fewer quantum levels for the higher amplitudes of the input signal. This nonlinear redistribution of the total number of levels available is called "companding," a verbal contraction of the terms "compression" and "expanding." Companding, therefore, balances the undesirable effects of quantizing error by reducing the magnitude of the quantizing error for low amplitude input signals where quantizing distortion would be a serious matter at the price of increased quantizing error for higher amplitude signals where increased distortion can be tolerated. Restated, the purpose of the PCM compander is to reduce the quantizing impairment of the original signal by quantizing on a non-uniform or non-linear, rather than a uniform or linear, basis.

A current practice in the quantization of analog signals for transmission in the telephone system applications is to encode the input signal logarithmically according to either a "mu-law" or "A-law" companding scheme as defined by H. Kaneko in an article entitled "A Unified Formulation of Segment Companding Laws and Synthesis of Codecs and Digital Companders," September, 1970, Bell System Technical Journal. Actually the quantum levels increase exponentially with increasing signal amplitude; however, the encoding characteristic is normally defined according to the inverse companding function and hence is referred to as a logarithmic encoding. Logarithmic mu-law or A-law encoding of signals provides reasonably constant signal to quantization noise levels over a wide dynamic range of input signals. Thus, logarithmic encoding is desirable for speech processing.

According to the mu-encoding law, *m* positive chords (segments) are defined, each consisting of an equivalent number of quantization steps. The step size in chord $i$, ($S_i$), is always equivalent to twice the step size of the preceding chord, i.e., $S_i = 2S_{i-1}$. When m positive chords are defined in order to track a given signal, the encoding is denominated as $mu = 2^m - 1$ code (as defined by Kaneko). Thus, for example, a digital $mu$ = 255 code implies an encoding scheme that employs eight positive and eight negative chords within which any given analog signal sample will be located. In practice, this would be referred to as a fifteen chord approximation law since the inner most positive and inner most negative chords are colinear.

An A-law encoding scheme is precisely the same as a mu-law encoding scheme except that the step size of the inner two positive and inner two negative chords are equal. Hence, with eight positive chords defined, an A-law encoding of the analog input would be denominated as a thirteen chord approximation.

In patent application, Ser. No. 385,095, filed Aug. 2, 1973, by Paul A. Wintz et al., an analog to digital converter is disclosed which may be used to convert analog signals, such as voice, into digital code words exhibiting logarithmic compression characteristics. Application Ser. No. 385,095 is hereby incorporated by reference and sets out in detail how an input analog signal may be encoded according to either a mu-law or A-law scheme. The digital code words created by such an encoder may, for example, be transmitted through a telephone network. Digital code words received at the terminating end of such a network are generally required to be converted into an analog signal representing an approximation of the encoded analog input signal. The time interval from the receipt of a code word to be decoded, until the time when the code word is decoded, that is, converted to analog form and output for any further desired processing, is defined as a decoding interval.

The prior art exhibits many digital to analog conversion devices and methods for performing the aforementioned conversion. Typically, a digital to analog converter may take as input, a digital code word and periodically compare the numerical value of the input code word with the contents of a digital counter. The counter is incremented (or decremented) periodically until the numerical value contained in the counter equals the digital value of the input code word. The time elapsed between the receipt of the input code word and the counter being modified to contain a number equal to the input code word may, for example, be used to determine when to "pick" an analog output signal off of a ramp. The ramp may be generated, for example, linearly or exponentially corresponding to the system companding law selected. The analog output signal created according to this prior art system would thus be a function, among other things, of not only the value of the input code word and the comparison speed of the converter but of the accuracy of the analog ramp circuits.

The prior art also includes digital logic which could, for example, control an off the shelf digital to analog converter. The signals generated by the digital logic and the decoding interval length would be a function of the decoding scheme selected.

In both of the above examples of prior art digital to analog converters, a sample and hold circuit would usually be required to retain the analog output signal from the time when the output signal is first generated until the time further processing of the analog output signal is required. That is, if the analog output signal approximation corresponding to the input code word is, for example, generated in only 25 microseconds of a 125 microsecond decoding interval, (ie. where for the sake of illustration decoding is being performed at an 8KHz rate), this signal would have to be retained in, expensive, analog sample and hold circuitry for a period of 100 microseconds in order to be made available for further processing at the end of the decoding interval.

It is an object of this invention to provide a method for decoding a digital input signal exhibiting logarithmic compression characteristics that can be implemented using a minimal amount of analog circuitry in conjunction with inexpensive, reliable, digital components.

It is a further object of this invention to provide a PCM decoder which directly converts digital code signals exhibiting logarithmic compression characteristics into an analog signal approximating an encoded analog input signal.

It is still a further object of this invention to provide a decoder which includes circuitry which operates at relatively low speed in performing decoding of digital code words exhibiting logarithmic characteristics.

SUMMARY OF THE INVENTION

According to the invention, digital code words, representative of samples of an analog input signal encoded according to a mu-law or A-law encoding scheme, are decoded directly into analog output signals representing an approximation of the analog input signal. The analog output signal is generated in a minimal amount of time and is maintained until needed for further processing under digital control thereby eliminating expensive, analog, sample and hold circuitry.

In accordance with the preferred embodiment of the invention, digital code words produced by a logarithmic companding process are input periodically to a means for storing digital signals. The binary value of a stored code word is periodically compared with a binary value contained in a counter. This comparison is periodically made within the decoding interval by digital magnitude comparison means. The counter is set initially and may be reset at the start of a decoding interval to a predetermined reference count. The counter is incremented (or decremented) after each comparison (but within a decoding interval) so as to eventually contain the same value appearing in the input storage means.

As the incrementing (or decrementing) of the counter is performed, the digital comparison means outputs one of three signals after each comparison. These outputs are (a) output signal 1 which indicates that the numerical value of the input code word is greater than the numerical value of the contents of the counter, (b) output signal 2 which indicates that the numerical value of the input code word is less than the numerical value of the contents of the counter, and (c) output signal 3, which indicates that the numerical value of the input code word is equal to the numerical value of the contents of the counter. These output signals serve the following functions.

If output signal 1 is generated (indicating that the reference count is less than the digital input code word), the digital counter connected to the means for comparing is to be incremented reflecting the fact that a "step-up" through the chord currently being traversed has been taken. Conversely, if output signal 2 is generated, (indicating that the reference count is greater than the digital input code word), the counter is to be decremented reflecting a "step down" through the chord being traversed. When output signal 3 is generated (indicating the value of the reference count in the counter equals the value of the input code word), the counter is to be "frozen." Additionally the three output signals are used to control an inverter control circuit which, in turn, controls the gain on an amplifier. The purpose of the inverter control circuit and the amplifier will be set out hereinafter.

Still further in accordance with the principles of the invention, the analog signal to be output at the end of a decoding interval is "built" incrementally in a means for summing, and starting from a predetermined analog reference signal. This analog reference signal is sequentially incremented (decremented) by the bin size determined by the chord being traversed. Given a time interval of $x$ seconds and a total number of bins traversed, $y$, the analog reference signal is incremented (decremented) by the bin size of the chord being traversed each $x$ divided by $y$ units of time. This incrementing (decrementing) of the analog reference signal continues until such time as the numerical value of the contents of the counter equals the numerical value of the contents of the input storage means. It should be noted that the contents of the counter and the analog output signal being built are "locked" together. In other words, the numerical value of the contents of the counter at a given point in time corresponds to that portion of the analog output signal generated up to the given point in time. Since the contents of the counter and the analog reference signal are to remain locked, the predetermined analog reference signal placed in the means for summing at the start of a decoding interval must correspond to the binary code word placed in the counter at that time. It should also be noted that a new digital code word may be input to the means for storing at the same time the means for summing and the counter are reset. That is, to say that all initialization or reinitialization is to be performed at the start of a decoding interval.

The counter that is connected to the means for comparing will serve to indicate which chord is being traversed and to which step in that chord the building of the analog output signal has progressed. According to the invention, digital logic is to be connected to the above mentioned counter for the purpose of converting digital information contained in the counter into one of a plurality of digital signals which will drive a standard digital to analog converter. The digital signal produced by the digital logic determines the level of an analog signal to be first generated by the standard digital to analog converter and eventually summed with the analog reference signal as part of the construction of the analog output signal.

The digital to analog converter output passes through the gain amplifier mentioned above. Apriori, the gain control on the amplifier is set by the inverter control circuit to plus "1" or minus "1" depending upon the output from the means for comparing. Whenever the output signal from the means for comparing indicates that the reference count is less than the digital input code word, the amplifier gain is set to plus 1. Whenever the output signal from the means for comparing indicates that the reference count is less than the digital input code word, the amplifier gain is set to minus 1. The reason for setting the gain to plus 1 when the reference count is less than the digital input code word is that incrementing of the analog reference signal is performed by summing the amplified signal with the prior analog reference signal. Thus, the positive gain of the amplifier will cause the prior analog reference signal to be increased. Conversely, when the amplifier is set to minus 1 the level produced by the standard digital to analog converter is to be used to reduce the analog reference signal and thus, needs to be affected by negative gain prior to summing with the prior analog reference signal.

Hence, the amplified standard digital to analog converter output signal is summed with the prior analog reference signal level to produce a new analog reference signal. This summing may be performed by a conventional integrator.

The new analog reference level will again be modified after the next comparison of the digital input code word and the reference count in the counter until such time as the reference count equals the digital input code word. When this occurs, the analog reference signal being generated by the summing means must be retained until the end of the decoding interval, the probability being that this analog reference signal (now the constructed analog output signal) was constructed before the end of said interval. Only in the case of extreme point values would the whole 125 microsecond decoding interval be required to build the analog output signal. Only in this extreme point case would the constructed analog output signal be ready for further processing when built. In every other case, the constructed analog output signal must be "retained" until the end of the decoding interval when further processing of the analog output signal may be required outside of the decoder disclosed herein.

Maintaining the analog output signal until the end of the decoding interval, is performed basically by the inverter control logic. Once an "equals" indication is received from the comparison means, the inverter control will cause the gain on the amplifier to be alternately set to plus 1 and minus 1 for the remainder of the decoding interval, while the counter, as indicated above, is frozen. The frozen counter will cause the digital logic to continuously extract the same chord bits thus causing the standard digital to analog converter, mentioned above, to generate a uniform analog signal. This signal will be "added in" and then "subtracted out" of the analog output signal continuously as the gain on the amplifier shifts from plus 1 to minus 1 in an alternating fashion. Thus the analog output signal is made to "toggle" at the clock rate about the required output signal value (within one step of the required value) until the end of the decoding interval. The maintained output signal may be utilized in any desired fashion at the end of the decoding interval, completing the decoding of an input code word.

It is a feature of this invention to employ digital components in an arrangement capable of performing mu and A-law decoding directly at minimal operating speeds.

It is a further feature of this invention to be able to perform mu and A-law decoding in a highly reliable and economical manner to the extent that the cost of individual decoders for each line of a transmission system (per line usage) becomes attractive.

BRIEF DESCRIPTION OF THE DRAWINGS

These and other features of the present invention will be more readily apparent from the following detailed description taken in conjunction with the accompanying drawing.

DETAILED DESCRIPTION

In order to more fully understand the principles of the invention, an illustrative embodiment will be presented which comprises a 7-bit mu = 255 decoder. Although it will be obvious to those skilled in the art how the decoder may be modified to accommodate any mu or A-law decoding scheme, such as "*n*" bit decoder, the details of the modifications required for such decoding will also be set out hereinafter.

Prior to proceeding with the description of the 7-bit decoder, two non-limiting assumptions will be made. First, it will be assumed that the binary code words input to the decoder represent an encoding of an input analog signal according to an eight step per chord, mu-255 encoding scheme as described in patent application Ser. No. 385,095. As pointed out in prior application Ser. No. 385,095, the number of steps per chord is a parameter and is to be determined by the resolution requirements imposed on the system. The number of steps per chord may be varied but is fixed herein for illustrative purposes. Secondly, and again for the sake of illustration, an 8KHz decoding rate is assumed. This is a nominal rate for servicing a standard T-1 telephone channel. It will be readily appreciated by those skilled in the art that the apparatus and method presented herein are compatible with any desired sampling rate and that the choice of the 8KHz rate is only for illustrative purposes.

Figure 1:
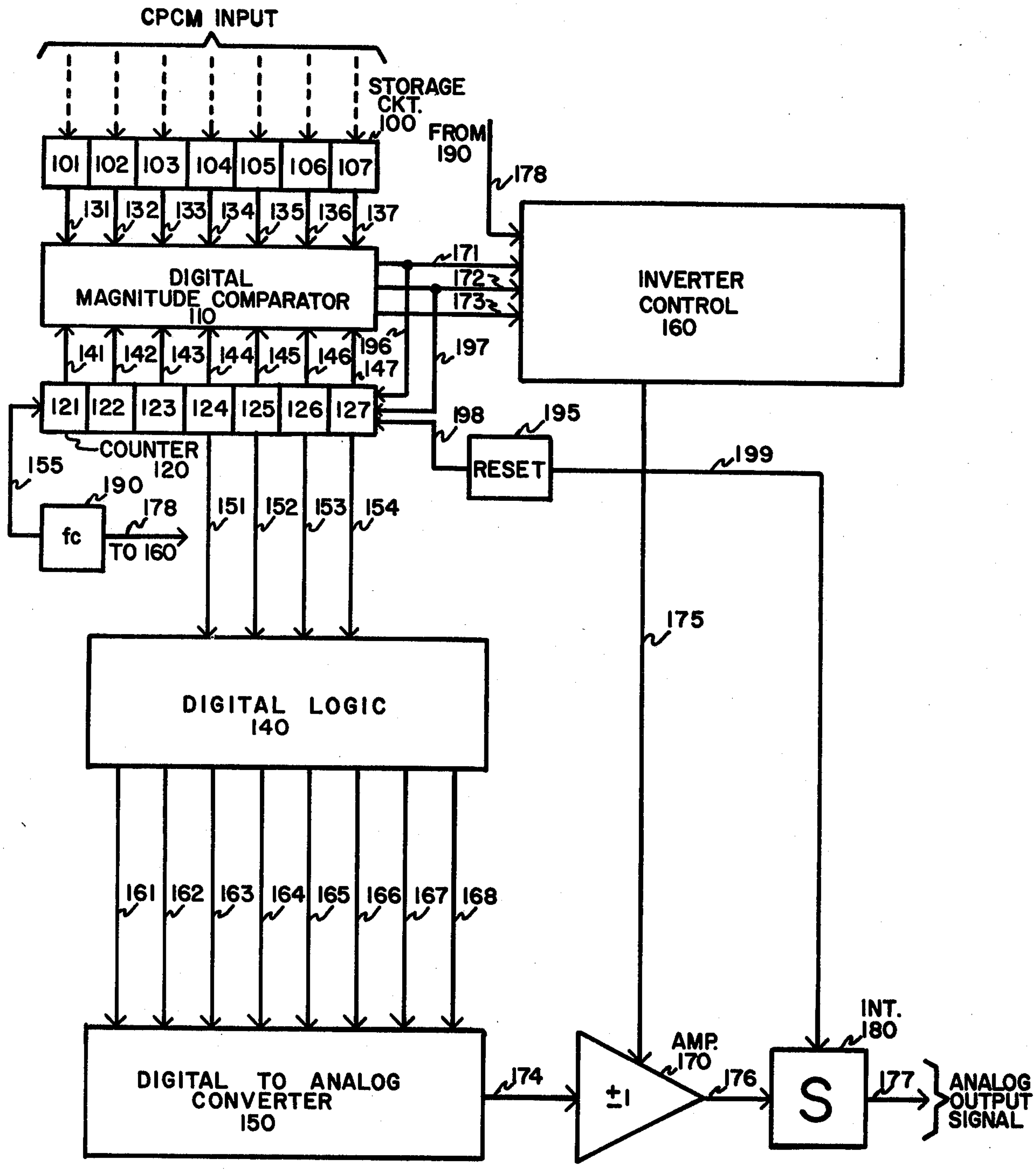
FIG. 1 displays a block diagram of a decoder embodying the principles of this invention.

FIG. 1 depicts in block diagram form a 7-bit mu-255 decoder. In the telephone system context, the code generated by a coder, such as the one described in patent application Ser. No. 385,095, is typically transmitted over a communication network prior to decoding. After the transmission through such a network, the code word (7-bit mu-255 code for illustrative purposes herein) would be input to storage device 100. Storage device 100 is typified by a 74195 which is a commercially available, off the shelf device.

Recalling that an 8KHz sampling rate has been assumed, a code word is input to device 100 every 125 microseconds according to this example. Thus, for the example, 125 microseconds would constitute a decoding interval. During the 125 microseconds that a code word remains in device 100, the decoder must generate an analog output signal approximating the analog input signal represented by the code word. The analog output signal may fully be realized at any time during the 125 microsecond interval, and is, in fact, generated at a point in time determined by the numerical value contained in device 100 and the decoder comparison speed as explained above. Since the analog output signal may be generated at various times during a 125 microsecond interval for different values in device 100, not only must the signal be "constructed," but it must also be retained until the end of a 125 microsecond interval when it will be output for further processing. The method and apparatus for performing the above stated functions will be presented below with additional reference being made to the drawings.

Referring again to FIG. 1, both input storage device 100 and counter 120 are displayed as 7-bit devices. Device 100 and counter 120, as depicted, have as their least significant bits, bit positions 101 and 121 respectively. The most significant bit positions displayed are position 107 for device 100 and position 127 for counter 120. The 3-bit field comprised of bit positions 101, 102, and 103 for device 100 and bit position 121, 122 and 123 for counter 120, indicates step (bin) numbers within a given chord. The 3-bit field comprised of bit positions 104, 105, and 106 for device 100 and bit positions 124, 125, and 126 for counter 120 indicate chord numbers. Bit positions 107 and 127 contain "sign information" for device 100 and counter 120 respectively. By sign information it is meant that when the bit is set to 1, positive chord numbers are indicated. Thus, for example, counter 120 set to 1000001 would contain the code for step 1 of the innermost positive chord. As a further example, the counter set to 1111110 would be representative of step 1 of the innermost negative chord (the step closest to the origin). Here it is assumed, without limiting the invention, that the outermost negative step is binary step number 0000000 and the outermost positive step is binary step number 1111111.

Recalling that for a mu = 255 encoding scheme, there are 16 chords and that eight steps per chord have been defined for illustrative purposes, there will be a total of 128 bins into which a sample of the analog signal may fall. Hence 1 of 128 values may be input to device 100. As indicated above, an analog reference signal is first chosen and modified periodically until the analog output signal desired is constructed. The reference signal may be chosen arbitrarily. If, for example, the reference signal is chosen to be 0 volts, 64 possible analog signals would lie below the chosen reference. Thus, in accordance with this illustrative example, the decoder must be capable of traversing 64 bins every 125 microseconds. This is so because the assumed decoding rate is 8 KHz and since it is to be further assumed that the decoder is reset to the reference signal at the start of each 125 microsecond interval. The last assumption is again for the sake of illustration only, for it will be set out in detail hereinafter how the apparatus may function without being reset.

In summary, the decoder being set out as the illustrative embodiment herein, must be capable of making a comparison approximately every two microseconds. Thus, the 7-bit mu-255 decoder being described would operate at a clock rate of 512 KHz.

The 512 KHz. operating rate of the decoder when compared with an approximate operating rate of 16 MHz that would be required to perform linear decoding with the same small signal resolution, clearly indicates the operating speed advantage gained by direct decoding according to the method described herein.

For the purposes of this disclosure logical true is equated with a line being "energized". Logical false is equated with a line not being energized.

The decoder D as shown in FIG. 1 basically is comprised of a clock 190 which, in the described embodiment, provides output signals over lines 155 and 178 approximately every two microseconds to counter 120 and inverter control 160 respectively. A digital code word input to the decoder via storage means 100, is compared every clock interval with the contents of counter 120 via digital magnitude comparator 110. Comparator 110 is connected to storage means 100 via lines 131–137 and is connected to counter 120 via lines 141–147. Comparator 110 will cause line 171 to be energized if the contents of storage means 100 are greater than the contents of counter 120. Comparator 110 will cause line 172 to become energized if the contents of storage means 100 and counter 120 are equal. Finally, comparator 110 will cause line 173 to become energized if the contents of counter 120 are greater than the contents of storage means 100. Lines 171, 172, and 173 are all input to inverter control 160. Inverter control 160 will provide a first input to amplifier 170 over line 175 to determine the gain of amplifier 170 in a manner to be set out in detail below.

Line 196, connected between counter 120 and line 171, provides a signal to counter 120 to "count up", whenever line 171 is energized and to "count down", whenever line 171 is not energized. Regardless of the signal on line 196, the counter will be inhibited or "frozen" whenever line 172 is energized. An indication of the state of line 172 is provided to counter 120 via line 197.

The chord bit positions 124 through 126 and sign bit position 127 of counter 120 are connected via conductors 151 through 154 to digital logic 140 which converts the sign bit information thus input from counter 120 into a signal which indicates which of the eight positive or eight negative chords is being traversed. The output of digital logic 140 is connected over conductors 161 through 168 to the input of D/A converter 150 which provides a representative analog signal over line 174 to a second input of amplifier 170, which analog signal corresponds to the size of the bins within the chord being traversed. As will be shown, amplifier 170 amplifies the analog signal on lead 174 by a factor of plus 1 or minus 1 in accordance with the signal on conductor 175 which, in turn, is determined by the relative value of the contents of storage means 100 and counter 120. The output of amplifier 170 is connected over line 176 to integrator 180. Integrator 180 has as its output the analog output signal being constructed. The analog output signal constructed by the decoder is output over line 177.

DECODING OPERATION

The decoding according to this invention begins by storing an input code word (7-bits) into device 100 and simultaneously initializing both counter 120 and integrator 180 as follows. Counter 120 is set to contain a reference count and integrator 180 is set to output a reference signal, both the count and the reference signal being indicative of the reference point chosen. Assume, without limiting the scope of the invention, that the reference chosen is 0 volts. Counter 120 would then be initially set to 0000001 and integrator 180 would be set to output 0 volts on line 177. The output of integrator 180, at the end of a decoding interval, will constitute the analog output signal which will substantially be transmitted over line 177.

After initializing the counter 120 and integrator 180, the input code word in device 100 is digitally compared with the reference count in counter 120. This comparison function is performed by comparator 110.

As indicated above, comparator 110 generates one of three output signals determined by the results of the comparison of the numerical value of the contents of device 100 and numerical value of the contents of counter 120. If the numerical value of the contents of device 100 is less than the numerical value of the contents of counter 120, a second signal, output signal 2, is output by comparator 110 onto line 173. When the numerical value of the contents of device 100 equals the numerical value of counter 120 a third signal, output signal 3, is output by comparator 110 onto line 172.

The output from comparator 110 (signal 1, signal 2, or signal 3) is input continuously to inverter control 160 and will be used to set the gain on amplifier 170. Inverter control 160 is completely digital and is described in detail hereinafter.

Whenever signal 1 is input to inverter control 160 on line 171, two responses are initiated. First, counter 120 is incremented by one unit. Since the least significant bit of counter 120 is bit position 121, a step field bit, the counter is incremented in response to signal 1 by at most one step every 2 microseconds (for the example being set out herein). Clock 190, connected to counter 120 by line 155, insures that the counter is operated only once every 2 microsecond clock interval. It should be noted that signal 1 is input to counter 120 via line 196 and that whenever line 196 is energized at the same time line 155 is energized, the counter will count up, that is, be incremented by one unit. The second response to signal 1 appearing on line 171 is the setting of the gain on amplifier 170 to plus 1 by inverter control 160. Both inverter control 160 and amplifier 170, and their functions in the circuit will be described in detail below.

Whenever signal 2 is input to inverter control 160, on line 173, two responses are initiated. First, counter 120 is decremented by one unit and secondly the gain on amplifier 170 is set to minus 1. It should be noted that the counter will be decremented in the absence of line 196 being energized, if (a) line 155 is energized and if (b) count inhibit line 197 has not been energized during the decoding interval. It should be noted, and it will be explained in greater detail in the following text, that line 197 only becomes energized after signal 3 is put on line 172. Again the function of inverter control 160 and amplifier 170 in the circuit set out herein will be described in detail below.

Assuming that the digital input code word in device 100 is initially greater than the reference count in counter 120, counter 120 will be incremented after the first comparison of the contents of device 100 with the contents within counter 120. In order to change the reference signal generated by integrator 180 which, it should be recalled, is locked to the numerical value in the counter, the following is to be performed by the apparatus displayed in FIG. 1.

Each clock interval will require that the reference signal be modified by the step size of the chord being traversed until such time as the contents of device 100 and the contents of counter 120 are equal. The information as to step size is extracted by the apparatus depicted in FIG. 1 as follows. Bit positions 124, 125, and 126 of counter 120, as indicated above, constitute a chord number. In other words, an indication of the chord number being traversed is contained in these bits. Thus, for example, if bits 124, 125, 126 were set to 1, 1, 0 respectively, it would be indicative of the fact that chord 3 is being traversed. Recall that the bits of decreasing significance appear on the left side of the counter as displayed in FIG. 1. Recall also that bit 127 will indicate whether negative or positive chord 3 is being traversed. Supposing bit 127 is set to a 1, then positive chord 3 is being traversed. Since decoding is being performed according to a mu = 255 decoding scheme in the current example, the step size of chord 3 is defined as four times the step size in the innermost positive chord.

Bits 124, 125, 126, and 127 are supplied on lines 151, 152, 153, and 154 respectively, to digital logic 140. The function of digital logic 140 is to convert the 3-bit chord number and the sign bit contained in counter 120 into an indication of which of the eight positive or eight negative chords is in fact being traversed. Recall that each of the eight positive chords (and their symmetric negative chord images) has a unique step size. Thus, a signal passed to digital to analog converter 150 indicative of the absolute value of the chord number in counter 120 will be sufficient to indicate to converter 150 the size of the signal to be generated corresponding to the step size of the chord being traversed. The above described extraction of data from the counter along with the conversion of this data into signals used to control converter 150 is performed by digital logic 140 as follows.

Figure 2:
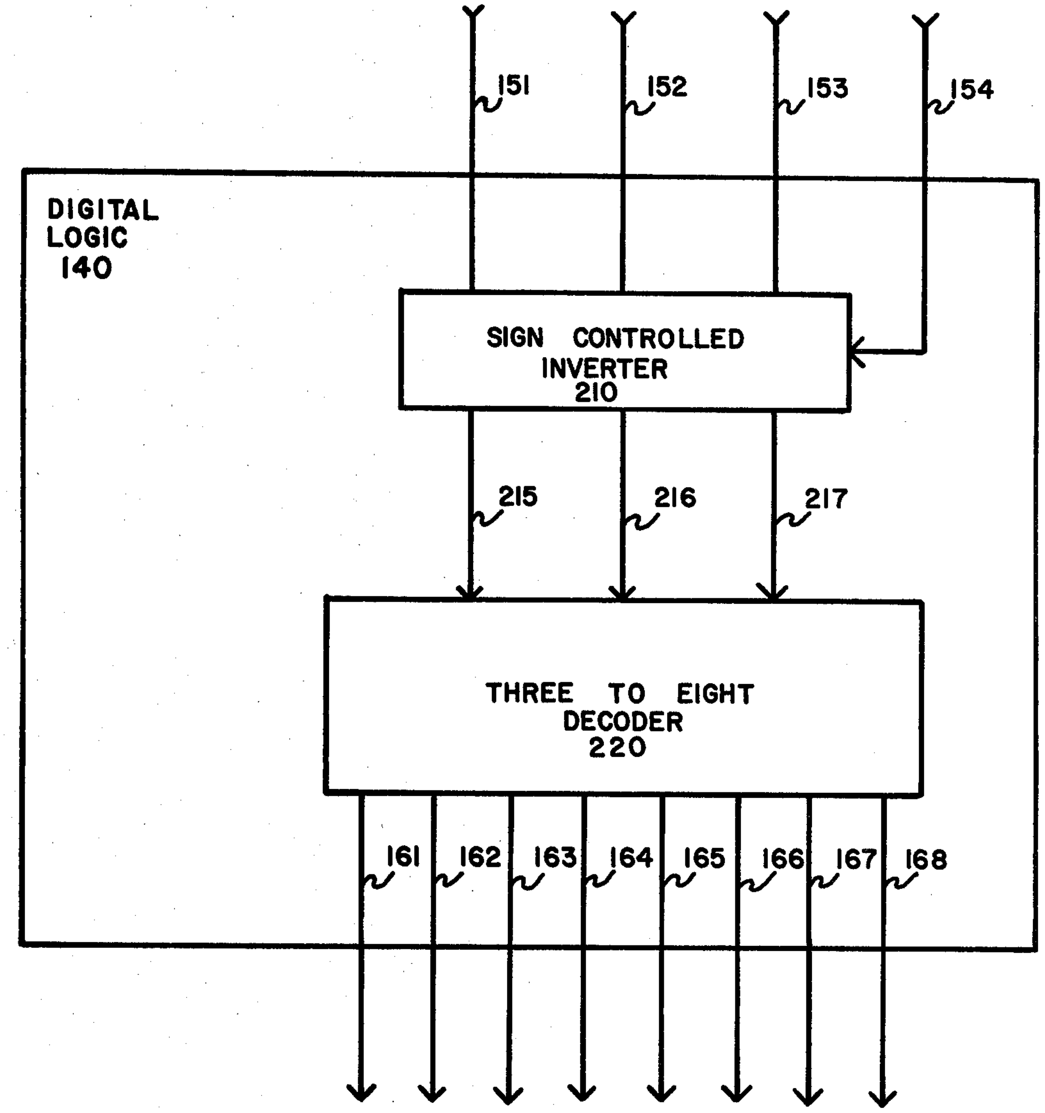
FIG. 2 displays the details of the digital logic portion of FIG. 1.

Reference to FIG. 2 should now be made in conjunction with FIG. 1. FIG. 2 displays digital logic 140 in detail.

Bits 124, 125, and 126 are input to sign controlled inverter 210 in digital logic 140 via lines 151, 152 and 153. Inverter 210 will invert the signals appearing on lines 151, 152, and 153 only when bit position 127 on line 154 contains a 0. The value, 1 or 0, of bit position 127 is input to converter 210 on line 154. Inverter 210 is a standard, digital component, typified by a commercially available 74H87 inverter.

After passing through inverter 210, the values appearing on lines 215, 216, and 217 represent the number (1 through 8 in the illustrative example) corresponding to the chord being traversed.

Lines 215, 216 and 217 connect inverter 210 to a 3 line to 8 line decoder shown in FIG. 2 as unit 220. Decoder 220 takes a 3-bit input representation of a binary number and energizes one of eight output lines based on the binary value of the three input bits. The 74155 is a commercially available device suitable for use in accord with this invention as a three to eight line decoder.

The output of decoder 220 is, as stated above, an input signal to digital to analog converter 150 indicating which of eight possible step sizes is to be produced during the corresponding two microsecond clock interval. As will be indicated below, the signal produced will eventually be summed with the prior reference signal to produce a logarithmically modified reference signal. Referring to FIG. 1, line 161 being energized corresponds to an address which causes converter 150 to produce a signal whose amplitude corresponds to the step size of the innermost chord. Line 162 being energized causes a signal whose amplitude is twice the step size of the innermost chord to be generated by converter 150, etc.

The output of converter 150, which, as indicated above, is one of eight step sizes corresponding to the eight step sizes of the present example, is input via line 174 to amplifier 170.

As indicated above, the gain on amplifier 170 is set to plus 1 or minus 1 depending on whether counter 120 is to be incremented or decremented until such time as line 172 is energized indicating the analog output signal has been constructed. Line 175 being energized will cause the gain on amplifier 170 to be set to plus 1. When line 175 is not energized the gain on amplifier 170 is set to minus 1. Inverter control 160, controls the state of line 175 in a manner to be set out in detail below.

If counter 120 is to be incremented, the gain on amplifier 170 must be set to plus 1 so that the amplifier output will, via integrator 180, increase the reference signal. Similarly, if counter 120 is to be decremented, the gain on amplifier 170 must be set to minus 1 so that the amplifier will, again via integrator 180, decrease the reference output signal. The output of converter 150 as amplified by amplifier 170 is supplied to integrator 180 via line 176.

If the end of a decoding interval has not been reached and the analog output signal has not been fully constructed (i.e., line 172 is not energized) the integrator output signal is modified during the next clock interval in the manner described above. When the contents of device 100 and counter 120 are equal, line 172 will become energized. The analog output signal is fully constructed when line 172 becomes energized, and must be held until the end of the decoding interval, i.e., if the end of the decoding interval does not occur when line 172 is energized, inverter control 160 is used to maintain the constructed analog output signal within one step of the analog signal which is to be processed at the end of the decoding interval.

Figure 3:
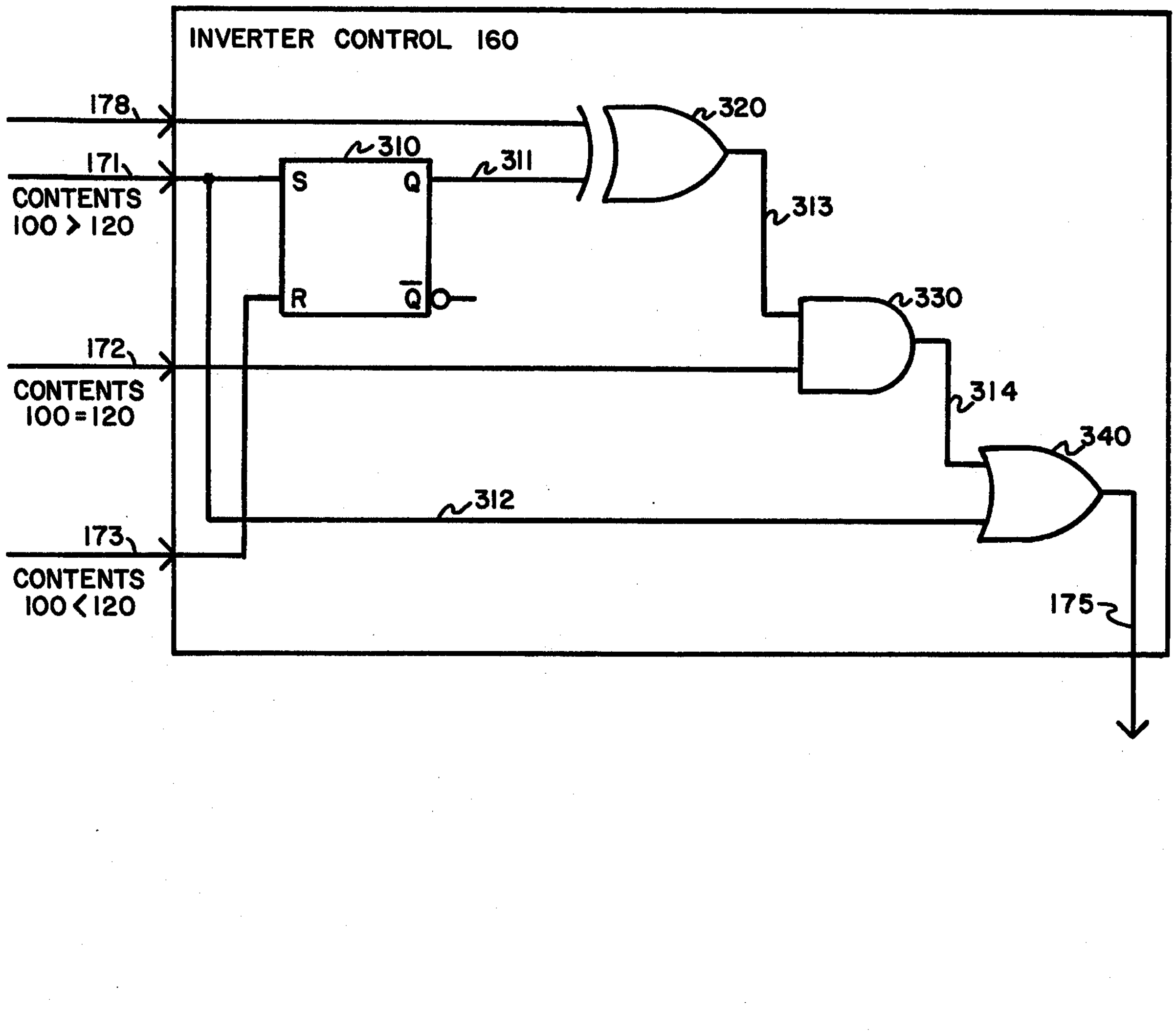
FIG. 3 displays the details of the inverter control portion of FIG. 1.
Figure 4:
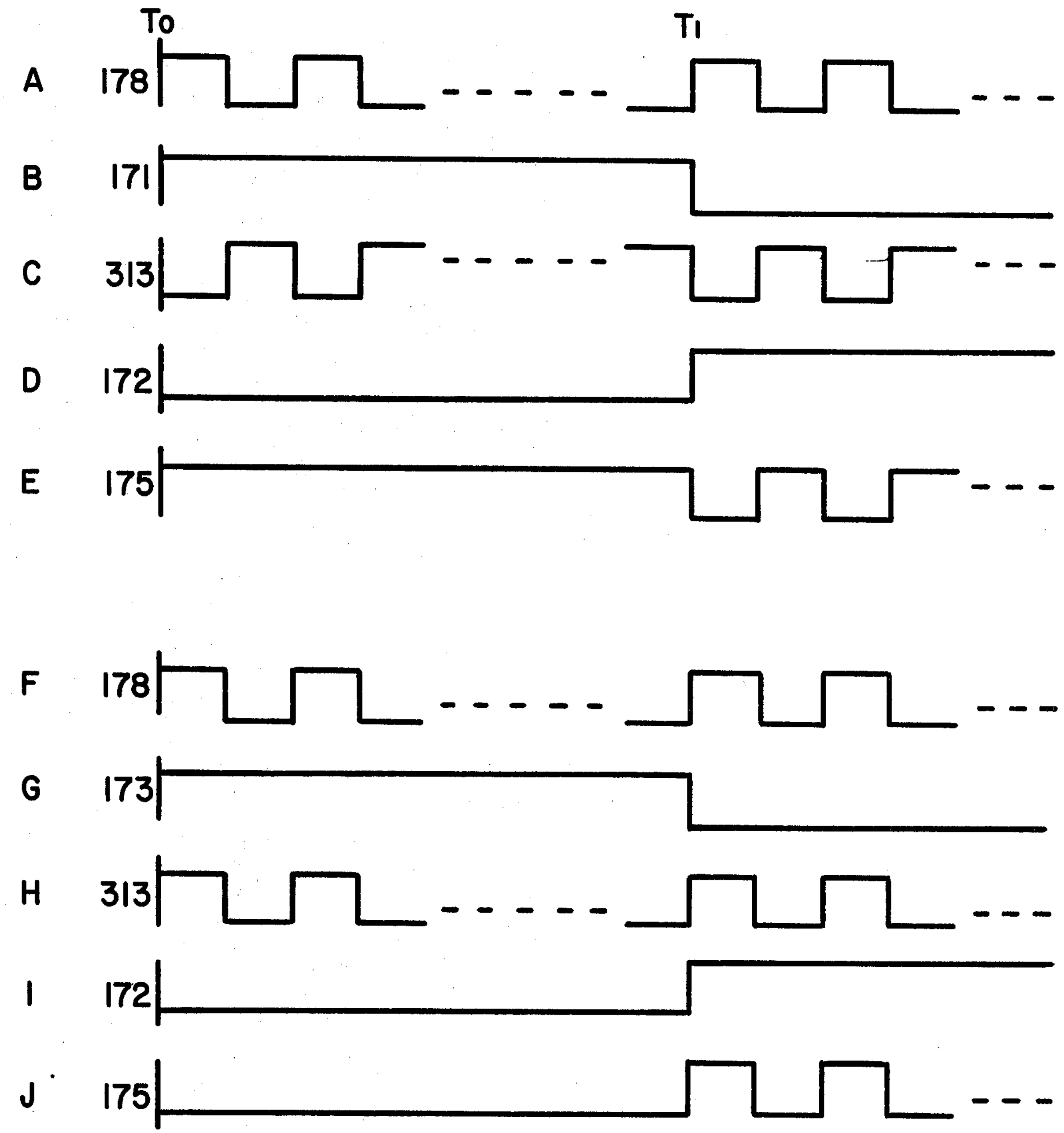
FIG. 4 displays the signals developed by the inverter control displayed in FIG. 3.

Inverter control 160 which, as explained above, sets the gain on amplifier 170 during the construction of an analog output signal and maintains a constructed analog output signal until required for processing, operates as follows:

Reference should now be made to FIGS. 3 and 4 in conjunction with FIG. 1 to fully understand the operation of inverter control 160.

Inverter control 160 takes four inputs during each given clock period (approximately 2 microseconds). One input is a clock pulse received on line 178 from clock 190. The other inputs are received on lines 171, 172, and 173. Only one line of the group of lines 171, 172, and 173 will be energized during a clock interval.

The clock pulse received on line 178 is always input to exclusive-OR gate 320. The second input to gate 320 comes from the Q output of set/reset flip-flop 310 via line 311. Line 171 is connected to the set terminal of flip-flop 310 and line 173 is connected to the reset terminal of flip-flop 310. Thus, the state of line 311 is determined by which of lines 171 or 173 is energized.

Consider, for example, the operation of inverter control 160 when line 171 is energized. Recall that line 171 being energized indicates that the numerical value of device 100 is greater than the numerical value of counter 120. Whenever line 171 is energized line 311 will be energized. Consequently, as may be seen with reference to FIG. 3 and signals A, B and C of FIG. 4, whenever line 311 is energized, the clock, incoming on line 178 (starting from initialization time $t_0$) will be inverted on line 313. This in turn will cause a zero output to appear on line 314. Line 314 is the output of AND gate 330 and is connected into OR gate 340. Note, however, line 171 is interconnected via line 312 to OR gate 340. Thus, as long as line 171 is energized, line 175 will be energized as shown by signal E of FIG. 4. Line 175 being energized causes the gain on amplifier 170 to be set to plus 1 which, according to the above, will cause the signal at integrator 180 to be incremented by the step size of the chord being traversed.

Consider now the operation of inverter 160 when the numerical value of the contents of device 100 is less than the numerical value of the contents of counter 120. Recall in this case, line 173 is energized. Referring to FIG. 4, signals F, G, and H, whenever line 173 is energized, line 311 will not be energized thereby causing line 313 to be energized with every clock pulse via gate 320. Since line 172 is never energized when line 173 is energized, gate 330 will cause a zero output to appear on line 314. Note also that line 171 is never energized when line 173 is energized. Thus, in the case being set out, the output on line 175, signal J of FIG. 4, will be a zero. Hence, whenever line 173 is energized, the gain on amplifier 170 will be set to minus 1, which, according to the above will cause the signal at integrator 180 to be decremented by the step size of the chord being traversed.

Finally, when line 172 is energized (at time $T_1$ in FIG. 4) the following occurs. First, counter 120 becomes inhibited via 172 becoming energized, through connector 197. Recall that when line 172 is energized indicating that the numerical value of contents of device 100 equals the numerical value of the contents of counter 120, the inverter control must toggle the analog output signal constructed at the integrator until the end of the decoding interval. In order to perform this toggling, inverter control 160 functions according to one of the following two cases.

In the first case (refer to signals A–E of FIG. 4) suppose the counter had to be incremented in order to reach the value contained in device 100. This would imply that prior to line 172 being energized (i.e., prior to time $T_1$), line 171 had been energized. Thus, according to the above, line 311 being the output of the Q terminal of flip-flop 310, would remain energized. This in turn would cause line 313 to become energized whenever a clock pulse is not input to gate 320. Line 313 becoming energized whenever the clock is "off," , in conjunction with line 172 being energized, will cause line 314 to become energized whenever a clock pulse is not present. Since line 314 into gate 340 remains off so long as line 172 is energized, line 175 will be energized whenever a clock pulse is not present and will not be energized whenever a clock pulse is present. This alternating pattern of ones and zeros on line 175, shown as signal E on line 175 of FIG. 4 (after time $T_1$), will cause the gain on amplifier 170 to be set to plus 1 when line 175 is energized and to minus 1 when line 175 is not energized. It should be noted that the first alternation is in an opposite direction with respect to the signal existing on line 175 prior to time $T_1$.

Recall counter 120 is frozen when line 172 becomes energized. This in turn causes converter 150 to output a continuous analog signal corresponding to the step size of the chord in which the counter has been frozen. Since the gain on amplifier 170 is alternately changed from plus 1 to minus 1, integrator 180 will thereby "add in", and then "subtract out" the signal being generated by converter 150 until the end of the decoding interval when reset may occur. Thus the desired toggling effect is provided via inverter control 160.

In the second case (referring to signals F–J of FIG. 4), when the counter had been counting down to the digital code word in device 100 before line 172 was energized, line 311 would not be energized. Thus, line 313 would become energized every time a clock pulse occurs and, in a symmetric manner with respect to the state of line 175 in case 1 above, an alternating pattern of ones and zeros will be output on line 175. The symmetric pattern of ones and zeros produced on line 175 for case 1 above versus case 2 above, may be seen by comparing signals E and J on line 175 of FIG. 4 after time $T_1$. Thus, just as with case 1 above, the analog output signal is made to toggle within a 1 step range until the end of the decoding interval. Again the first alternation on line 175 is in the opposite direction with respect to the signal that existed on line 175 prior to time $T_1$.

Hence, inverter control 160 is used to set the gain on amplifier 170 in accordance with the relationship of the numerical value of the contents of device 100 and the numerical value of the contents of counter 120 so that an analog output signal may first be constructed and then held until required for processing. It should be noted that inverter control 160 is completely digital and that in being used to "hold" the constructed output signal until the end of the decoding interval, expensive, analog, sample and hold circuitry is eliminated.

According to the illustrative example of the decoding operation set out herein, the analog output signal is read out every 125 microseconds to service, for example, an 8KHz T-1 channel. According to the example at the beginning of each 125 microsecond interval, device 100, counter 120 and integrator 180 will be reinitialized. Referring to FIG. 1 reset device 195 is depicted and is shown connected to counter 120 via line 198 and also is shown connected to integrator 180, via line 199. The reinitialization process according to the illustrative example would comprise, storing a new digital input code word into device 100, resetting the counter to 0000001 and resetting the integrator to output 0 volts. This reinitialization procedure may be eliminated by sufficiently increasing the clock speed and simply reading into device 100, new code words, periodically. This would result in a continuous decoding operation.

What has been particularly disclosed via the illustrative example constitutes both a novel method of decoding and novel apparatus for decoding a digital input code words created according to a mu = 255 encoding law. As indicated above, the number of steps per chord defined may vary according to the encoding scheme chosen so as to increase the resolution capability of the system. For example, if sixteen steps per chord were required, counter 120 would simply become an 8-bit counter, with a 4-bit field reserved for step number. Also, device 100 would have to be modified to become an 8-bit device for holding 8-bit code words.

The invention is similarly not limited to a 15 segment (eight positive chord) mu-law approximation. If, for example, decoding for a 31 segment mu-law approximation were desired, the number of chord bits would be increased to 4 and the digital logic would be required to be modified only so that a 4-bit field instead of a 3-bit field, could be converted to a 1 of 16 versus 1 of 8 output code. This modification is believed to be obvious in light of prior art. The digital to analog converter would have to be capable of producing sixteen different levels instead of only eight signal levels; however, this is again believed to be an obvious modification of a prior art device.

Thus, the invention described herein may perform decoding of code words created according to an arbitrary *n* step, *m* chord mu encoding law.

To perform decoding of signals according to an A-law encoding scheme with the apparatus depicted in FIG. 1, the decoder must be modified so that two of the eight outputs of logic 140 cause a single signal level to be generated by converter 150. These two outputs correspond to steps generated by the two innermost chords (positive or negative) and as stated above, the A-law requires the step size of these chords to be identical. Thus, converter 150 generates a signal corresponding to the step size on the innermost chord whenever the chord bits of counter 120 represent any of the two innermost positive or negative chords. A representation of any other chord in the counter would cause the step to be modified logarithmically in accordance with the A-law.

The modifications required to the circuit depicted in FIG. 1 to perform such encoding are believed to be obvious. For example, to perform 13 segment A-law decoding, line 162 of FIG. 1 could always be inhibited when energized and line 161 could instead become energized. Line 163 being energized could always become inhibited when energized and line 162 could become energized beyond the inhibition point, etc. Thus, without modifying the converter, the signal level sizes for performing A-law decoding could be generated.

The modifications to the counter, digital logic, etc., to perform A-law decoding for *n* steps and *m* chords, parallels the modifications set out above for performing *n* step and *m* chord mu-law decoding and are believed to be obvious.

In summary, then, the decoder described performs decoding of input signals that have been logarithmically encoded according to either a mu or A-law. The decoder described may be utilized on a per line basis featuring a minimal operating speed and low cost.

It should be noted that the invention described herein has been illustrated with reference to a particular embodiment. It is to be understood that many details used to facilitate the description of such a particular embodiment are chosen for convenience only and are not limitations on the scope of the invention. Many other embodiments may be devised by those skilled in the art without departing from the scope and spirit of the invention. Accordingly the invention is intended to be limited only by the scope and spirit of the appended claims.

What is claimed is:

1. In an apparatus for decoding input digital code words, input means over which said input digital code words are received, storage means for storing said digital code words, first reference means for providing a predetermined reference code word, comparison means for comparing the value of the stored digital code word with said reference code word, means connected to said comparison means including first circuit means for incrementing and decrementing the reference code word provided by said first reference means at a predetermined rate in the direction of the value of said digital code word during a predetermined time period, second reference means connected to said comparison means for providing a reference signal including means operative after equalization of said stored digital word and said reference code word has been achieved to vary said reference signal between a first and a second value for the remaining predetermined time period.

2. In an apparatus for decoding input digital code words, input means over which said input digital code words are received, storage means for storing said digital code words, first reference means for providing a predetermined reference code word, comparison means for comparing the value of the stored digital code word with said reference code word, means connected to said comparison means including first circuit means for incrementing and decrementing the reference code word provided by said first reference means at a predetermined rate in the direction of the value of said digital code word during a predetermined time period, signal processing means connected to said first reference means to derive a representative analog signal from said first reference means, second reference means connected to said comparison means for providing a reference signal which indicates the relative value of said reference code word and said stored code word prior to equalization of said words and which is operative after equalization of said words has been achieved for varying said reference signal between a first and second value for the remaining period of said predetermined time period.

3. In an apparatus for decoding input digital code words, input means over which said input digital code words are received, storage means for storing said digital code words, first reference means for providing a predetermined reference code word, comparison means for comparing the value of the stored digital code word with said reference code word, means connected to said comparison means including first circuit means for incrementing and decrementing the reference code word provided by said first reference means at a predetermined rate in the direction of the value of said digital code word during a predetermined time period, signal processing means connected to said first reference means to derive a representative analog signal from said first reference means, second reference means connected to said comparison means for providing a reference signal which indicates the relative value of said reference code word and said stored code word prior to equalization of said words and which is operative after equalization of said words has been achieved for varying said reference signal between a first and a second value for the remaining period of said predetermined time period, and gain adjusting means for varying the gain of said representative analog signal in response to the value of said reference signal.

4. An apparatus as set forth in claim 3 in which said gain adjusting means includes amplifier means connected to the output of said signal processing means, and in which said second reference means comprises means for readjusting said amplifier means to alternatively provide a minus 1 and plus 1 gain.

5. An apparatus as set forth in claim 4 in which said second reference means comprises a logic circuit which enables the plus 1 gain for said amplifier means whenever the numerical value of said stored signal is greater than the numerical value of the reference code word provided by said first reference means, and which enables the minus 1 signal gain for said amplifier means whenever the numerical value of said stored signal is less than the numerical value of the reference code word provided by said first reference means.

6. An apparatus as set forth in claim 3 which includes first, second and third path means connected to the output of said comparison means, and in which said comparison means provides an output signal over said first path means whenever the numerical value of the stored signal is greater than the numerical value of the reference code word provided by said first reference means, and an output signal over said second path means whenever the numerical value of the reference code word provided by said first reference means is greater than the numerical value of the stored signal, and an output signal over said third path means whenever the numerical values of said stored signal and said reference code word are equal.

7. An apparatus as set forth in claim 6 in which said second reference means further includes a first logic circuit connected to said first and second path means to provide a signal which indicates the particular one of said first and second path means which is energized, clock means, first gate means connected to said first logic circuit and said clock means, AND gate means connected to said third path means and the output of said first gate means, and output gate means connected to the output of said AND gate means and said first path means.

8. An apparatus as set forth in claim 3 in which said reference signal provided by said second reference means prior to equalization is a steady state signal, and in which the signal output from said second reference means after equalization is an alternating signal.

9. An apparatus as set forth in claim 8 in which a first alternating signal is output by said second reference means whenever the reference code word is initially greater than the stored code word, and a second alternating signal is output by said second reference means whenever the stored code word is initially greater than said reference code word.

10. In an apparatus for decoding input digital code words according to a logarithmic decoding scheme in which a plurality of chords, each having a plurality of steps, is defined, comprising input means over which said digital code words are received, input storage means for storing each of said digital code words as received, first reference means for providing a predetermined reference code word, the numerical value of said code word corresponding to the code for said predetermined analog output reference signal including means for providing a set of code signals which represent step number, chord number, and at least a sign of the chord number, comparison means connected to said input storage means and said first reference means for providing output signals indicating the relative value of said reference code word and said input code word, means connected to said comparison means responsive to said output signals to cause said reference code word to be incremented whenever said input code word is numerically greater than said reference code word and to be decremented whenever the said input code word is numerically smaller than said reference code word, signal processing means connected to said first reference means operative to provide analog signals of different values in response to the receipt of input code signals which represent different ones of said chord numbers, second reference means connected to said comparison means to provide a reference signal which represents the relative value of the stored and reference code words, adjusting means for adjusting the value of said analog signals in accordance with the value of said reference signal, and summing means for summing the signals output from said adjusting means with a predetermined analog output reference signal which corresponds with the value of said predetermined reference code word to thereby provide a modified analog output reference signal corresponding to the digital code word in said first reference means.

11. An apparatus as set forth in claim 10 in which said adjusting means comprises a variable gain amplifier.

12. An apparatus as set forth in claim 10 in which said first reference means further comprises an up/-down counter, and control means connected to the output of said comparison means to control said up/down counter to count in the direction of and to the number contained in said input storage means.

13. An apparatus as set forth in claim 12 in which said counter includes a plurality of bit positions for representing the numerical value of said reference code word including a first set of bit positions assigned to represent the step number, a second set of bit positions assigned to represent the chord number, and a third set of bit positions assigned to represent at least the sign of the chord, and output means for connecting the bit output of at least said second and third sets of bit positions to said signal processing means.

14. An apparatus as set forth in claim 13 in which said signal processing means includes means operative to logarithmically vary the analog signal output according to the chord indicated as being traversed by the bit signals input thereto.

15. An apparatus as set forth in claim 10 which includes clock means, means connecting the pulses output from said clock means to said first reference means to control incrementing and decrementing thereof at a given rate, and means connecting the output of said clock means to said second reference means, and in which said second reference means is operative to provide a steady value reference signal during adjustment of the value of the code word in said first reference means to said stored code word, and a clocked reference signal after the values of said reference code word and said stored code word are equal.

16. A method for digitally decoding a digital input code word according to a $2^m$ chord, a $2^n$ step, logarithmic decoding scheme, comprising the steps of comparing said digital input code word with a predetermined reference code word, generating a first signal whenever said digital input code word exceeds said reference code word to increment a counter by one step, generating a second signal whenever said digital input code word does not exceed said reference code word to decrement said counter by one step, extracting from said counter the number corresponding to the chord being traversed, converting said extracted number into a unique signal indicative of the chord which is being traversed and generating an analog signal level which represents the cord number, modifying the generated analog signal level by different factors for said first and second signals, and summing said modified analog signal level with a reference signal the value of which initially corresponds to said predetermined reference code word and which is modified continuously to indicate the value of said reference code word at discrete intervals.

17. A method as set forth in claim 16 which includes the further steps of generating a third signal as the value of said reference code word equals the value of said digital input code word, locking the value of said reference code word at the equalization value, and adjusting the analog signal level alternately by said different factors.

18. A method for digitally decoding a digital input code word according to a $2^m$ chord, $2^n$ step, logarithmic decoding scheme comprising the steps of comparing said digital input code word with a predetermined reference code word, generating a first signal whenever said digital input code word exceeds said reference cord word to increment a $2^n$ step, $2^m$ chord digital counter by one step, generating a second signal whenever said digital input code word does not exceed said reference code word to decrement said counter by one step, extracting from said counter the binary number corresponding to the chord number being traversed, converting said extracted number into a unique signal indicative of which of said $2^m$ chords is being traversed, generating a different analog signal level for different converted binary numbers, amplifying the generated analog signal level by a factor of +1 whenever said first signal is input to said counter, and amplifying said generated analog signal level by a factor of −1 whenever said second signal is input to said counter, and integrating said amplified analog signal level with a reference signal, the value of which initially corresponds to said predetermined reference code word and which is modified continuously to indicate the value of said reference code word at discrete intervals.

19. A method of decoding an input code word comprising the steps of storing said input digital code word, providing a reference digital code word of a predetermined value, comparing said input digital code word with said reference digital code word, adjusting the value of said reference digital code word in the direction of the value of said stored input digital code word, providing further signals which represent the relative values of said digital input and reference code words prior to and at the time of equalization, providing an analog signal which corresponds to the value of the adjusted digital reference code word, deriving a reference signal from said further signals which indicate the relative differences of said stored and reference code words, adjusting the gain of said analog signal in accordance with the value of said reference signal, and summing the gain adjusted analog signal with a further reference signal which initially corresponds to said predetermined value and which is modified continuously to indicate the value of said reference code word, and generating an equalization signal as the value of the reference code word equals the value of said input code word, locking the value of said reference code word at the equalization value and adjusting said further reference signal between a first and second value until such time as said further reference signal is required for further processing at discrete intervals.

* * * * *